US005103130A

United States Patent [19]

[11] Patent Number: 5,103,130

[45] Date of Patent: Apr. 7, 1992

Rolt et al.

[54] SOUND REINFORCING SEAL FOR SLOTTED ACOUSTIC TRANSDUCERS

[76] Inventors: Kenneth D. Rolt, 132 Washington St., Arlington, Mass. 02174; Peter F. Flanagan, 27 Applehouse Dr., Cranston, R.I. 02920

[21] Appl. No.: 286,689

[22] Filed: Dec. 20, 1988

[51] Int. Cl.[5] .......... H01L 41/08

[52] U.S. Cl. .......... 310/337; 310/322; 310/369; 367/159

[58] Field of Search .......... 310/337, 340, 344, 321, 310/322, 323; 367/155-161, 165-167, 171, 172

[56] References Cited

U.S. PATENT DOCUMENTS

| | | | |
|---|---|---|---|
| 2,772,405 | 11/1956 | Schurman et al. | 367/159 X |
| 2,812,452 | 11/1957 | Harris | 310/322 |
| 3,947,802 | 3/1976 | Tims et al. | 367/159 |
| 4,409,681 | 10/1983 | White | 367/159 X |
| 4,435,794 | 3/1984 | Marshall et al. | 310/337 X |
| 4,651,044 | 3/1987 | Kompanek | 310/323 |
| 4,682,070 | 7/1987 | Plambeck | 310/337 X |

*Primary Examiner*—Mark O. Budd
*Attorney, Agent, or Firm*—Denis G. Maloney; Richard M. Sharkansky

[57] ABSTRACT

A split-ring or split-cylinder transducer in which a full or partial boot covering a shell is caused to be looped into the gap of the shell so that outward radial movement and circumferential expansion of the shell causes the boot to also move outwardly thus reinforcing the sound wave generated exterior to the shell of the transducer.

13 Claims, 2 Drawing Sheets

40

40'

SOUND REINFORCING SEAL FOR SLOTTED ACOUSTIC TRANSDUCERS

BACKGROUND OF THE INVENTION

This invention relates to seals for slotted transducers and more particularly to seals for transducers which have one or more slots parallel to the axis of a cylindrical transducer to provide a watertight seal to the interior portion of the cylindrical transducer. The types of transducers to which this invention is particularly applicable may be characterized as the split-ring or split-cylinder type of transducer having a single slot parallel to the transducer axis and the slotted-ring or slotted-cylinder type of transducer which has more than one slot parallel to the transducer axis. These latter transducers are also characterized as multi-slotted rings or multi-slotted cylinders. All these transducers are grouped together because, as viewed externally, they all have a slotted cylindrical (or near cylindrical) appearance and will be referred to herein as split-ring transducers.

These prior art electrical to acoustic split-ring transducers are driven by the variety of means which include natural piezoelectrics (e.g. quartz), synthetic piezoelectrics (e.g. a ceramic), magnetostriction, variable reluctance (a magnetic drive), and moving coil drives. The various drive mechanisms are well known in the art of acoustic transducer design and may be utilized with the transducers which incorporate this invention. Typical embodiments of prior art split-ring transducers are found in W. T. Harris, U.S. Pat. No. 2,812,452 issued Nov. 5, 1957, and as modified in H. W. Kompanek, U.S. Pat. No. 4,651,044, issued Mar. 17, 1987.

For the prior art fluid-filled transducer 10 shown in end view in FIG. 1, the shell 11 is shown with a gap 14 through which the fluid 13 in which the transducer 10 operates exits and enters the interior 16 of the transducer 10. The interior of the split-ring transducer may be either fluid-filled, or fluid-filled with a pressure release device such as an air- or gas-filled bladder 18 within the interior of the split-ring transducer. The direction arrows 19 illustrate the direction of water flow when the transducer 10 has its drive member 12 (shown as a segmented ceramic drive) electrically energized to cause the shell 11 to expand. The exterior surface 15 of shell 11 moves the fluid in the direction 19 thereby producing the exterior compressive sound field. At the same time, a rarefield sound field is created within water 13 in the interior 16 of transducer 10. Two defects exist with this transducer. First, the interior and exterior sound fields (which are out-of-phase) destructively interfere with each other when the interior waves escape through slot 14 or through the ends of the cylinder. This causes a reduction in sound power output. Second, the fluid mass that rushes to-and-fro within slot 14, and at the ends of the cylinder as well, tend to raise the mechanical Q of the transducer. This limits the transducer operating band because the width of the resonance peak is very sharp. There are also attendant viscous mechanical losses which occur with fluid flow at slot 14 and cylinder ends, which further reduces sound power output.

The interior and exterior out-of-phase acoustic radiation problem also exists in a free-flooded transducer ring as shown in FIG. 2 where the acoustic transducer 20 is suspended by support member 27 at its nodal point 17 to the interior of an oil 21 filled enclosure 22 which is immersed in water 13. Enclosure 22 is typically an open-mesh metal cage 23 with a watertight rubber cover 24. An advantage of having the transducer 20 immersed in an oil-filled container is the electrical insulation provided by the oil which makes the construction of the transducer electrical components substantially more simple. The transducer 20 is also protected from marine organisms which may exist in the water environment. The free-flooded ring transducer 20 suffers from serious degradation in acoustic output because of oil flow into and out of its interior 16 as shown by flow direction arrows 19 through slot 14 and arrows 25 through open ends 26. Transducer 20 assembly 28 does have the advantage of eliminating a potentially severe hydrostatic pressure problem because equal fluid pressure is always maintained on the interior and the exterior of the transducer.

Fluid-filled transducers frequently use a bladder 18 as shown in FIGS. 1 and 2 to provide a pressure-release volume on the interior of the split-cylinder transducers 10, 20. The pressure release bladder 18 minimizes the effects of the out-of-phase cancellation of the interior to exterior sound field. Use of the gas-filled bladder does, however, introduce problems which limit its usefulness.

A partial solution to the acoustic radiation cancellation problem is to completely seal the interior 16 of the transducer 30 as shown in cross-sectional view in FIG. 3 with a rubber seal or boot 31 which covers the slot 14 and shell 11 ends (not shown) to provide a water seal to prevent water from entering the gas 35 (preferably sulfur hexaflouride) or air-filled interior 16 of the transducer 30. The exterior surface 32 of the boot 31 is in contact with water 13 when the transducer 30 is in operation. The large discontinuity in acoustic impedance at the air 35-water 13 interface provided by boot 31 at slot 14 significantly prevents acoustic waves from escaping from the interior 16 to the exterior 33 and in turn destructively influencing the desired exterior sound radiation. The boot 31 can be made from any suitable material or materials which can withstand the rigors of immersion in deep ocean water and can withstand the hydrostatic and dynamic-drive loads imposed upon it. The boot 31 is shown slightly depressed into slot 14 as it would be when the transducer is immersed in water. The tension produced at the ends 11' of shell 11 by boot 31 at slot 14 significantly changes the resonance frequency with change of water depth and also reduces the bandwidth of the resonance, both of which create operational difficulties since the frequency of the electrical power transmitter should be the same as the resonance frequency of the transducer for maximum power from the transducer.

SUMMARY OF THE INVENTION

The aforementioned problems are overcome and other objects and advantages are provided by a split-ring or split cylinder transducer in accordance with the invention in which the boot is caused to be looped into the gap of the shell so that outward radial movement and circumferential expansion of the shell causes the boot to also move outwardly thus reinforcing the sound wave generated exterior to the shell of the transducer.

BRIEF DESCRIPTION OF THE DRAWINGS

The aforementioned aspects and other features of the present invention will be apparent from the following description taken in conjunction with the accompanying drawings wherein.

DESCRIPTION OF THE PREFERRED EMBODIMENT

Figure 2:
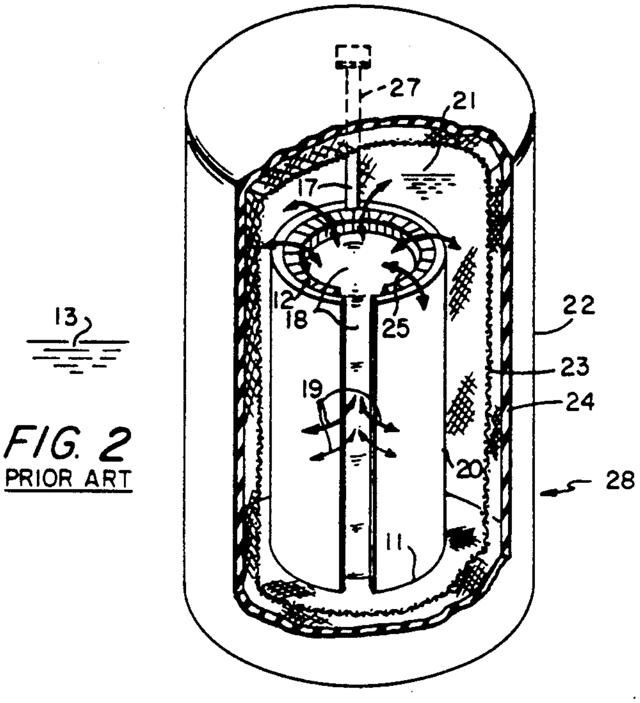
FIG. 2 PRIOR ART
FIG. 2 is an isometric view of the transducer of FIG. 1 within an enclosure.
Figure 1:
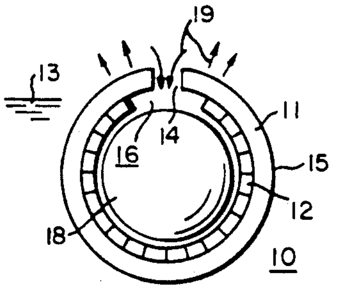
FIG. 1 PRIOR ART
FIG. 1 is an end view of a prior art split-ring transducer.
Figure 3:
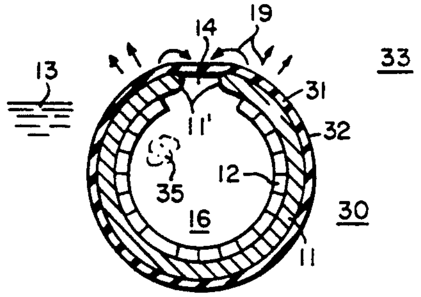
FIG. 3 is a cross-sectional view of a booted prior art transducer.
Figure 4:
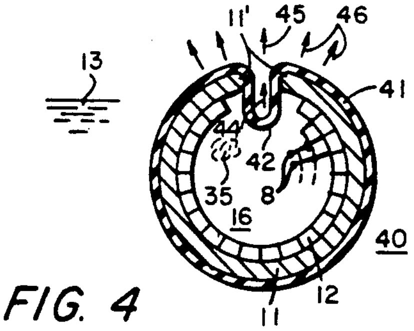
FIG. 4 is a cross-sectional view of one embodiment of the transducer of this invention.

Referring now to FIG. 4, there is shown a preferred embodiment of the invention in cross-sectional view. The shell 11 and drive member 12 of the transducer 40 of FIG. 4 may be the same as employed in the prior art transducer of FIGS. 1, 2. The watertight boot 41 confines gas 35 within shell 11 by extending over the entire surface of transducer 40 including its ends (not shown in FIG. 4) and also extending inwardly through the slot 14 to the interior portion of shell 11 to form slot-filling loop 42. Expansion of the shell 11 by electrical actuation of the drive material 12 causes the boot loop 42 within the slot 14 to also move outwardly. The shell edges 11' at the slot 14 actually have two combined motions when moved by driver 12 whose terminals 8 are connected to an alternating current source (not shown). There is a radial (outward) motion combined with tangential motion. Both of these motions tend to make the slot-filling loop 42 of boot 41 become more taut. In the limit, the loop 42 would flatten into a planar sheet. Thus, loop 42 causes additive sound radiation to that produced by movement of shell 11. The outward movement shown by direction arrow 44 of the boot loop 42 improves fluid 13 loading on transducer 40, and adds an additional source of sound because the water 13' extending into the boot loop 42 moves in the same direction 45 as the water motion 46 produced by an outward movement of shell 11. The boot loop 42 also provides a watertight seal at slot 14 and because of the large air-water impedance mismatch prevents the interior sound waves contained in the air or other gas 35 within the transducer interior 16 from mixing with and destructively cancelling the external sound waves produced in the water by the shell 11.

Figure 5:
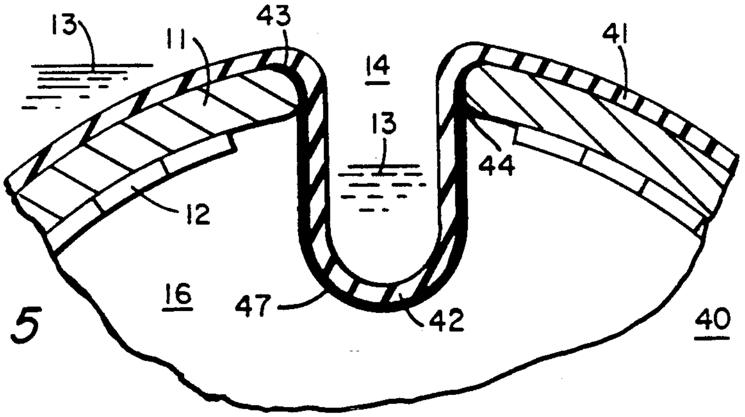
FIGS. 5 and 6 are expanded cross-sectional views showing the boot loop seal of this invention.
Figure 6:
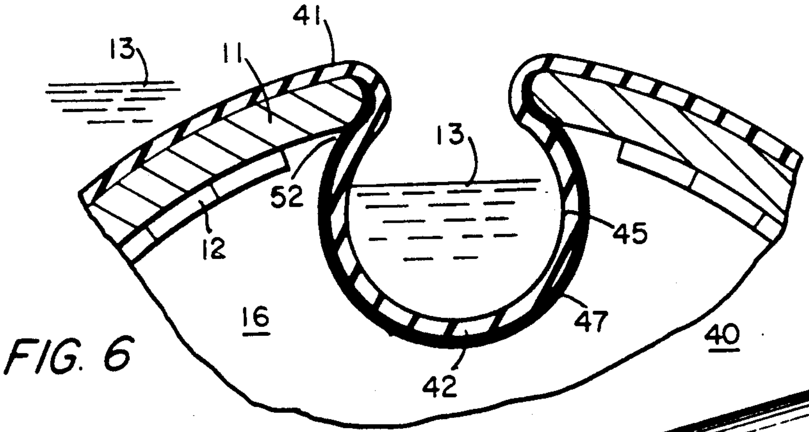

A more detailed drawing of the boot seal 42 portion of the cross-sectional view of FIG. 4 is shown in FIG. 5. The shell 11 has a smooth radius 43 where the boot seal 42 is under the compression stress of the water 13 when the transducer 40 is at deep water depths. Since the boot seal 42 will tend to have a circular cross-sectional configuration under water pressure as shown in FIG. 6, the inner portion 44 of the shell 11 at the gap 14 also has a smooth radius. The smooth radii 43, 44 eliminate the sharp edges that could cause damage to the boot loop 42 when under water pressure. It is preferred that the boot loop 42 extend sufficiently far into the interior 16 so that the approximately circular configuration 45 of the loop 42 be retained at the most outwardly extreme position of the shell 11. This retention of the circular shape 45 of the boot loop 42 reduces the stress in loop 42 to a minimum when under the pressure of the water 13 within the boot loop 42. If the depth of the loop is not adequate, the boot 42 will become noncircular and the stress produced within the material of the loop 42 will increase greatly relative to the stress in the circular configuration shown in FIG. 6. Since the boot loop 42 should be deep enough to avoid the situation where it would be required to stretch in order to accomodate the maximum outward excursion of the shell 11, the boot is preferably made of a material stiff in pure tension to withstand ocean pressures but flexible in bending to not influence mechanical resonance. A reinforced water-impermeable material such as reinforced rubber or a metal such as beryllium-copper which is sufficiently thin so that it is flexible in bending to configure itself into a loop of approximately the circular cross-section but yet having high tensile strength so that it resists stretching are suitable. The beryllium-copper loop 47, in FIG. 6, may be formed to provide a watertight seal with the shell 11 to prevent water from entering the interior 16 of the transducer. Alternatively, also as shown in FIG. 6, the shell 11 and the beryllium copper loop 47 may be covered with a nonreinforced elastomer 41, typically a rubber, in order to protect the shell 11 and beryllium-copper loop 47 from the ocean environment and to provide a watertight enclosure in the event the beryllium-copper 47 and shell 11 are not perfectly bonded to each other to provide a watertight seal. In addition to the specifically recited materials for the boot loop 42, a material such as a composite plastic, or a composite of elastomer and metal, having sufficient tensile strength and bending flexibility and resistance to water may be used for the boot 41 and boot loop 42.

Figure 7:
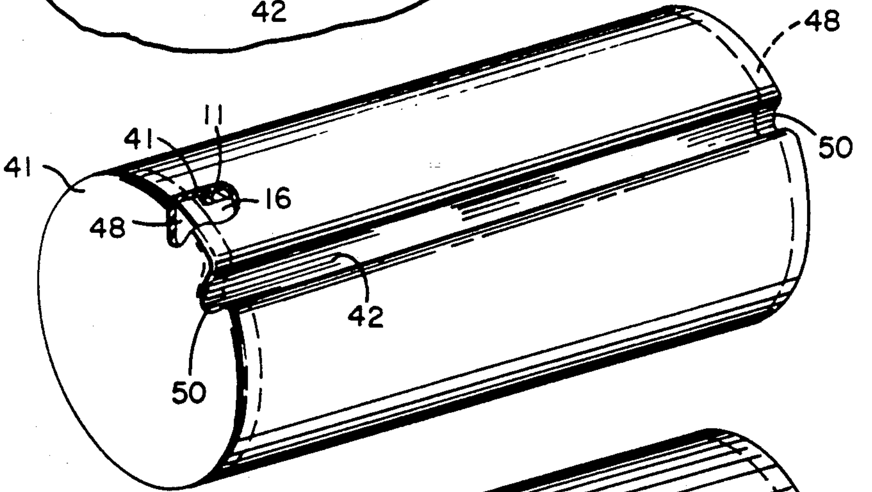
FIGS. 7 and 8 are isometric views of completely booted transducers of this invention.
Figure 8:
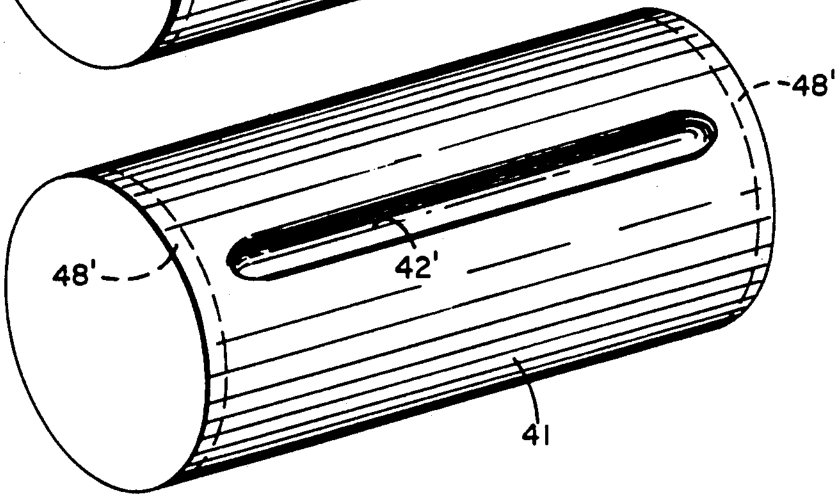

FIG. 7 shows an isometric view of a cylindrical transducer having a single longitudinal slot 14 with its outer surface completely covered with a suitable boot material such as the elastomer 41 of FIG. 6. End cover plates 48 provide a surface against which the water pressure is applied when the transducer 40 is immersed and which provide the support for the covering elastomer 41 to maintain the watertight enclosure in the interior 16 of the transducer 40. In the slot 14, the elastomer has the loop 42 form such as that shown in FIGS. 5, 6. End plates 48 each have a notch 50 approximately matching that of the loop 42 so that the elastomer loop 42 is continuous along the length of transducer 40. Alternatively, a transducer 40', shown in the isometric view of FIG. 8, has end plates 48' which are not notched and the loop 42' of elastomer 41 gradually becomes shallower near the end plates 48' until there is no loop at the end plates 48'.

Although the invention has been described in terms of a cylindrical type of transducer having a single slot, the invention is applicable for filling any slot, linear or circular, in a split or slotted ring or cylindrical acoustic transducer.

Figure 9:
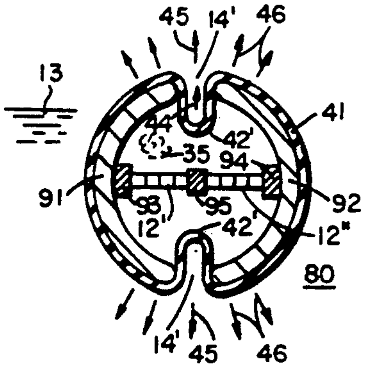
FIG. 9 is a cross-sectional view of a different embodiment of this invention.

FIG. 9 shows a cross-sectional view of a multi-slotted transducer 80 incorporating this invention. The two shells 91, 92 and longitudinal ceramic drives 12', 12" are suitably secured to each other by end pieces 93, 94, respectively, and by an axial support member 95. The drive assembly 12', 12" maintains the shells 91, 92 in their desired spaced relationship having gaps 14' with loops 42'. Operation of the loops 42' to provide pressure reinforcement is as explained with respect to FIG. 4. A common-strain segmented drive method similar to 12 shown in the prior art FIG. 1 could also be used in FIG. 9 to operate transducer 80.

Having described a preferred embodiment of the invention, it will be apparent to one of skill in the art that other embodiments incorporating its concept may be used. It is believed, therefore, that this invention should not be restricted to the disclosed embodiment but rather should be limited only by the spirit and scope of the appended claims.

What is claimed is:

1. A transducer comprising:
a movable member having an interior and at least one slot exposing said interior;
transduction driver means in contact with said movable member;
means, covering said slot in the movable member, for providing a watertight enclosure for said movable member; and a flexible loop portion of said means penetrating through said slot and extending through only a portion of the interior of said movable member.

2. A transducer comprising:
a movable member having a slot through a wall thereof with said slot having a slot width:
transduction driver means having electrical energization means in contact with said member to cause said slot width to vary in accordance with electrical energization of said driver;
a flexible member having a loop portion disposed within said slot; and
means disposed about said movable member for providing a watertight seal around said movable member including said flexible member and loop portion to confine a gas within said movable member.

3. A transducer comprising:
a cylindrical member having an axis of symmetry;
said cylindrical member being hollow with a wall thickness;
said wall having a slot extending through said wall;
transduction driver means in contact with said wall;
a watertight flexible seal covering said slot and said cylindrical member to contain a gas within said cylindrical member; and
a loop portion of said watertight flexible seal disposed in said slot.

4. The transducer of claim 3 wherein said slot extends axially along said cylindrical member.

5. The transducer of claim 3 wherein:
said slot has a width dimension;
said transduction driver means has means for applying electrical energization to said driver means; and
said driver means in contact with said wall causes said slot to vary its slot width in response to energization of said driver means.

6. The transducer of claim 5 wherein said watertight seal comprises a flexible material bonded to said cylindrical member; and
wherein variations in slot width cause the loop portion of the seal to move in such a manner as to positively reinforce sound wave generation of the transducer.

7. The transducer of claim 6 wherein said material is an elastomer.

8. The transducer of claim 6 wherein said material is beryllium-copper.

9. The transducer of claim 3 wherein said loop is U-shaped.

10. The transducer of claim 3 further comprising:
a loop of metal attached to said cylindrical member at said slot;
first and second end plates cover open ends of said cylindrical member with the watertight flexible seal covering said cylindrical member, said loop of metal, and said end plates to form a gas-filled watertight transducer.

11. The transducer of claim 10 wherein the metal of said loop is beryllium-copper.

12. The transducer of claim 3 wherein:
said cylindrical member has end plates covering the ends of said cylindrical member; and
said watertight seal also covers said end plates.

13. A transducer comprising:
a shell naving an interior and an exterior;
an electrical to mechanical transduction driver means in compressive contact with said shell;
said shell having an opening between said shell interior and exterior;
activation of said driver means acting upon said shell;
a boot covering said opening to provide a watertight gas-filled shell; and
a flexible portion of said boot extending within the interior of said wall.

* * * * *